United States Patent Office 3,157,842
Patented Nov. 17, 1964

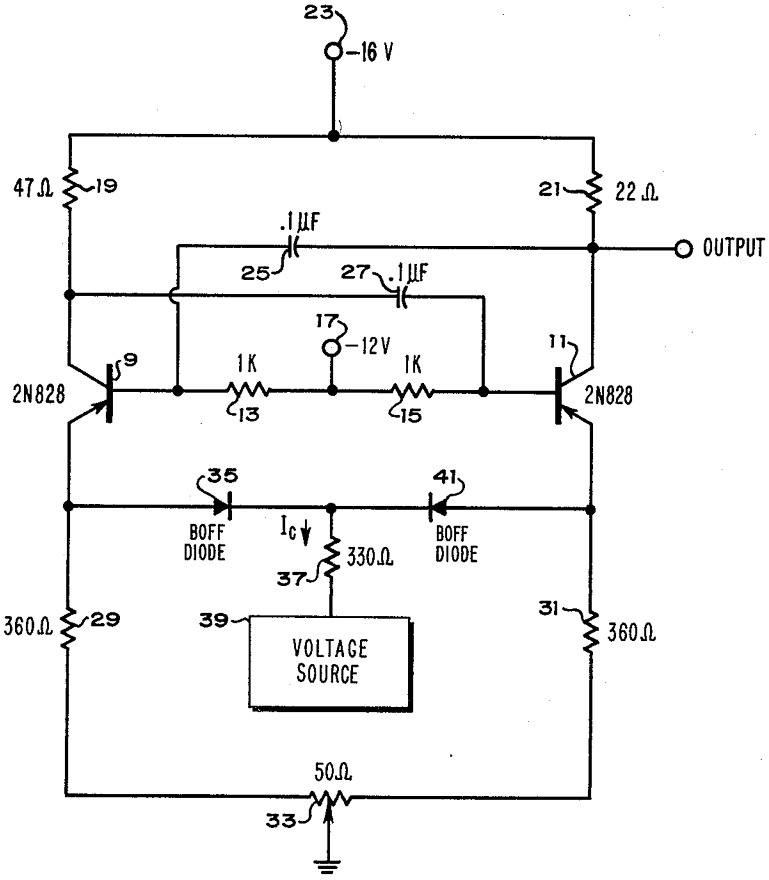
INVENTOR
BAS HOEKS
BY J. C. [signature]
ATTORNEY

3,157,842

MULTIVIBRATOR CIRCUITS USING STEP RECOVERY DIODES AS TIMING ELEMENTS

Bas Hoeks, Palo Alto, Calif., assignor to Hewlett-Packard Company, Palo Alto, Calif., a corporation of California
Filed June 1, 1962, Ser. No. 199,434
5 Claims. (Cl. 331—113)

This invention relates to astable circuits and more particularly to a multivibrator which eliminates resistance-capacitance timing circuits and which produces a wide range of output frequencies by varying the amplitude of a control current.

Certain semiconductor devices known as step recovery diodes show very fast changes in reverse conductivity, which changes are much faster than the rate of change of the current applied to the device. These devices are believed to store carriers in the immediate vicinity of the junction during forward conduction. They show a sudden depletion of these stored carriers during subsequent reverse conduction. The depletion of stored carriers occurs in a time considerably shorter than the carrier lifetime. Devices of this type are described in U.S. patent application Serial No. 27,943, filed May 9, 1960 and entitled P-N-Type Junction Semiconductor Devices and Method of Making the Same, now abandoned and in J. Moll, S. Krakauer and R. Shen, "P-N Junction Charge-Storage Diodes," Proceedings of the IRE, volume 50, January, 1962, pages 43–53.

This period of reverse conduction is determined by the amount of charge stored in the vicinity of the junction during forward conduction and by the rate of depletion of the stored carriers during subsequent reverse conduction. The output frequency of a multivibrator circuit using these devices may thus be determined simply by adjusting the rate at which stored carriers are depleted. This is done by varying the amplitude of the carrier depletion current.

An object of this invention is to provide a high frequency multivibrator which operates over a wide range of frequencies and which eliminates the resistance-capacitance timing circuits commonly used in low frequency multivibrators.

It is another object of the present invention to provide a semiconductor multivibrator which operates at frequencies of the order of 100 megacycles.

It is still another object of the present invention to provide a high frequency multivibrator in which the output frequency may be varied over a wide range of the order of 100 to 1 by varying the amplitude of a control current.

In accordance with the illustrated embodiment of the present invention a multivibrator is provided with two step recovery diodes in place of conventional resistance-capacitance timing circuits. Charge is stored in the vicinity of the junction of one of these diodes during one half-cycle of operation when one amplifier of the multivibrator is rendered heavily conductive. During the other half-cycle of operation the charge which was previously stored in one diode is depleted, while the charge which was previously depleted is again stored in the other diode. The operating frequency is thus determined by the rate at which the stored carriers are depleted and hence, by the carrier depletion current.

Other and incidental objects of the present invention will be apparent from a reading of this specification and an inspection of the accompanying drawing which shows a schematic diagram of the circuit of the present invention.

Referring now to the drawing, there is shown a pair of transistors 9 and 11 having the base electrodes connected through resistors 13 and 15 to voltage supply 17. The collector electrodes of the transistors are connected through resistors 19 and 21 to voltage supply 23. Coupling elements such as capacitors 25 and 27 connect the base electrode of one transistor and the collector electrode of the other transistor. The combinations of resistor 15 and capacitor 27 and of resistor 13 and capacitor 25 have time constants which are very much larger than the period of the lowest operating frequency of the circuit. Direct-current coupling may also be obtained by using Zener diodes in place of the coupling capacitors. Two current paths are provided for the emitter circuit of each of the transistors. The first path for each of the transistors includes a resistive connection to ground such as through resistor 29 and the symmetry balancing resistor 33. The second path includes step recovery diode 35 and resistor 37 serially connected between the emitter electrode of transistor 9 and voltage source 39. The second path for the emitter of transistor 11 includes step recovery diode 41 and resistor 37 serially connected between the emitter electrode and voltage source 39. The diodes 35 and 41, which may be called "Boff diodes" for convenience have diffused junctions about which the gradient of impurity concentration on each side of the junction increases rapidly with distance therefrom. As previously noted, these diodes are capable of storing charge in the immediate vicinity of the junction during forward conduction and are capable of sustaining reverse conduction until the stored carriers are depleted. The sudden depletion of the stored carriers occurs in a time which is considerably shorter than the carrier lifetime and which is typically of the order of a fraction of a millimicrosecond. This depletion of stored carriers produces an abrupt change in the reverse conductivity of the diode.

One of the transistors is rendered more heavily conductive than the other during a half-cycle of circuit operation. Heavy current flowing in transistor 9, for example, flows through resistor 29 and through serially-connected resistor 31 and devices 35 and 41. Carriers are stored about the junction of device 41 during forward conduction while the stored carriers about the junction of device 35 from the previous half-cycle are depleted. Reverse current flow through device 35 continues until the supply of carriers stored therein becomes suddenly depleted. At that instant a signal appears on the collector of transistor 9 as a result of the decrease in the current in that transistor. This signal is coupled to the base electrode of transistor 11 and renders that transistor more heavily conductive. The signal thus appearing on the collector electrode of transistor 11 when coupled to the base electrode of transistor 9 further reduces the conductivity of transistor 9. The transistors may be biased always to operate in the conduction regions in order to increase the operating frequency of the circuit. Current which previously flowed in the forward direction through diode 41 and in the reverse direction through diode 35 then changes direction and flows in the forward direction through diode 35 and in the reverse direction through diode 41. Current flow in the reverse direction through diode 41 thus continues until the supply of carriers stored therein during the previous half-cycle becomes suddenly depleted. When this occurs the cycle is repeated.

The frequency at which the circuit operates is determined primarily by the magnitude of the current $I_c$. Resistor 37 and variable voltage source 39 operate substantially as a current source producing control currents ranging from approximately 12 milliamperes substantially to zero current. The amplitude of the control current $I_c$ determines the rate at which the stored carriers in one of the diodes is depleted during reverse conduction. An increased rate of depletion of stored carriers thus decreases the half-cycle period and hence increases the frequency of the output signal.

The circuit of the present invention thus provides a current-controlled rate generator or multivibrator which can be varied over a wide range of frequencies and which can be operated at extremely high freqencies. In addition, the circuit of the present invention eliminates the need for resistance-capacitance timing circuits to obtain accurately adjustable output frequencies. Further, the output frequency is substantially independent of supply voltage variations and is determined only by the amplitude of the applied control current.

I claim:

1. A multivibrator comprising a pair of amplifiers adapted to be alternately conductive, each of said amplifiers having first and second electrodes forming an input circuit and having said second electrode and a third electrode forming an output circuit, each of said amplifiers forming an output signal at the third electrode thereof in response to a change in the conductivity of said amplifier, means coupling the first electrode of each of said amplifiers to the third electrode of the other of said amplifiers, first and second semiconductor devices having junctions about which the gradient of impurity concentration increases rapidly with distance, said devices being capable of storing charge in the immediate vicinity of the junction during forward conduction and being capable of sustaining reverse conduction in the presence of stored charge, and circuit means including first and second devices serially connected in conduction opposition and connecting said second electrodes, said circuit means being responsive to the sudden depletion of stored carriers in one of the first and second devices to alter the conductivity of one of said amplifiers.

2. A multivibrator comprising a pair of amplifiers adapted to be alternately conductive, each of said amplifiers having first and second electrodes forming an input circuit and having said second electrode and a third electrode forming an output circuit, each of said amplifiers forming an output signal at the third electrode thereof in response to a change in the conductivity of said amplifier, means coupling the first electrode of each of said amplifiers to the third electrode of the other of said amplifiers, first and second semiconductor devices having junctions about which the gradient of impurity concentration increases rapidly with distance, said devices being capable of storing charge in the immediate vicinity of the junction during forward conduction and showing sudden depletion of stored carriers upon subsequent reverse conduction, biasing means including the first and second semiconductor devices and connecting the second electrodes of each of the amplifiers, said first and second devices being serially connected in conduction opposition, said biasing means being responsive to the sudden depletion of stored carriers in one of the first and second devices to alter the conductivity of one of said amplifiers.

3. A multivibrator comprising a pair of amplifiers adapted to be alternately conductive, each of said amplifiers having first and second electrodes forming an input circuit and having said second electrode and a third electrode forming an output circuit, each of said amplifiers forming an output signal at the third electrode thereof in response to a change in the conductivity of the output circuit thereof, means coupling the first electrode of each of said amplifiers to the third electrode of the other of said amplifiers, first and second semiconductor devices having junctions about which the gradient of impurity concentration increases rapidly with distance, said devices being capable of storing charge in the immediate vicinity of the junction during forward conduction and showing sudden depletion of stored carriers upon subsequent reverse conduction, a current source, means including the first device and said current source and forming a conduction path for the output circuit of one of the amplifiers, means including the second device and said current source and forming a conduction path for the output circuit of the other of the amplifiers, the first and second devices being serially connected in conduction opposition between said second electrodes and being responsive to the sudden depletion of stored carriers in one of the first and second devices to alter the conductivity of the conduction path in the output circuit of one of said amplifiers.

4. A multivibrator comprising a pair of transistors to be alternately conductive, each of said transistors having base and emitter electrodes forming an input circuit and having said emitter electrode and collector electrode forming an output circuit, each of said transistors forming an output signal at the collector electrode thereof in response to a change in the conductivity of the output circuit of said transistor, means coupling the base electrode of each of said transistors to the collector electrode of the other of said transistor, biasing means for said input and output circuits, first and second semiconductor devices having junctions about which the gradient of impurity concentration increases rapidly with distance, said devices being capable of storing charge in the immediate vicinity of the junction during forward conduction and showing sudden depletion of stored carriers during subsequent reverse conduction, a variable current source, means including the first device and said current source and forming a conduction path for the current in the output circuit of one of said transistors, means including the second device and said current source and forming a conduction path for the current in the output circuit of the other of said transistors, the first and second devices being serially connected in conduction opposition between the emitter electrodes of said transistors and being responsive to the sudden depletion of stored carriers in one of the first and second devices to alter the conductivity of the conduction path in the output circuit of one of said transistors.

5. A multivibrator comprising a pair of amplifiers, each having first and second electrodes forming an input circuit and having said second electrode and a third electrode forming an output circuit, means connected to the second and third electrodes of said amplifiers for supplying bias signals thereto; each of said amplifiers forming an output signal at the third electrode thereof in response to a change in the conductivity of said amplifier, means coupling the first electrode of each of said amplifiers to the third electrode of the other of said amplifiers, first and second step recovery diodes having junctions about which the gradient of impurity concentration increases rapidly with distance from the junction, said diodes being capable of storing charge in the immediate vicinity of the junction during forward conduction of current therethrough and being capable of sustaining reverse conduction in the presence of stored charge, and means including said first and second diodes serially connected in conduction opposition between the input circuits of said amplifiers for altering the conductivity of one of said amplifiers in response to the sudden depletion of stored carriers in one of the first and second diodes.

References Cited by the Examiner

UNITED STATES PATENTS 2,982,869 5/61 Cagle -------------- 307—88.5

OTHER REFERENCES

Article by Grimsdell, Nov. 1958, page 645 in Electronic Engineering.

ROY LAKE, *Primary Examiner.*

JOHN KOMINSKI, *Examiner.*